United States Patent
Furukawa et al.

(10) Patent No.: US 10,003,009 B2
(45) Date of Patent: Jun. 19, 2018

(54) COMPOSITE PIEZOELECTRIC CERAMIC AND PIEZOELECTRIC DEVICE

(71) Applicant: TDK CORPORATION, Tokyo (JP)

(72) Inventors: Masahito Furukawa, Tokyo (JP); Yoshikazu Shimura, Tokyo (JP); Taku Masai, Tokyo (JP); Satoshi Wada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 412 days.

(21) Appl. No.: 14/633,649

(22) Filed: Feb. 27, 2015

(65) Prior Publication Data
US 2015/0249201 A1 Sep. 3, 2015

(30) Foreign Application Priority Data

Mar. 3, 2014 (JP) .................................. 2014-040293
Jan. 6, 2015 (JP) .................................. 2015-000830

(51) Int. Cl.
*H01L 41/187* (2006.01)
*H01L 41/083* (2006.01)

(52) U.S. Cl.
CPC ...... *H01L 41/1873* (2013.01); *H01L 41/1871* (2013.01); *H01L 41/083* (2013.01)

(58) Field of Classification Search
CPC ............. H01L 41/1873; H01L 41/1871; H01L 41/083; C04B 35/4682
USPC .................................................. 310/358, 365
See application file for complete search history.

(56) References Cited

U.S. PATENT DOCUMENTS

| | | | |
|---|---|---|---|
| 2007/0216264 A1* | 9/2007 | Furukawa | H01L 41/083 310/366 |
| 2008/0210564 A1* | 9/2008 | Motoki | H01G 4/012 205/122 |
| 2010/0264354 A1* | 10/2010 | Uraki | C04B 35/495 252/62.9 PZ |
| 2012/0068127 A1* | 3/2012 | Kawase | C04B 35/4682 252/519.12 |
| 2014/0339458 A1* | 11/2014 | Furukawa | H01L 41/1873 252/62.9 PZ |

FOREIGN PATENT DOCUMENTS

| | | |
|---|---|---|
| JP | 2003-252681 A | 9/2003 |
| JP | 2009-227482 A | 10/2009 |
| JP | 2012-254913 A | 12/2012 |

* cited by examiner

*Primary Examiner* — Bryan Gordon
(74) *Attorney, Agent, or Firm* — Oliff PLC

(57) ABSTRACT

A composite piezoelectric ceramic includes a compact of crystal particles including at least one of potassium niobate ($KNbO_3$) and sodium niobate ($NaNbO_3$) and optionally further including lithium niobate ($LiNbO_3$), and a layer containing barium titanate ($BaTiO_3$) that is disposed on the surface of the compact while forming a heterojunction with the compact. A piezoelectric device includes the composite piezoelectric ceramic.

8 Claims, 7 Drawing Sheets

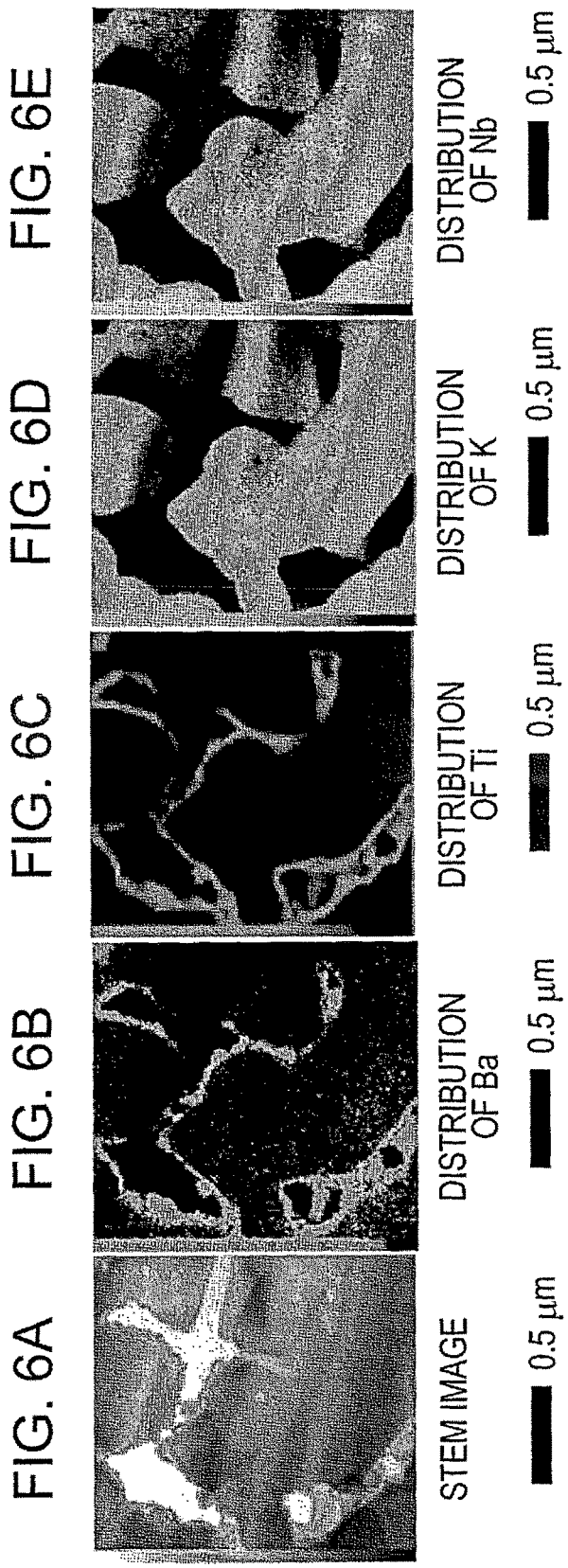

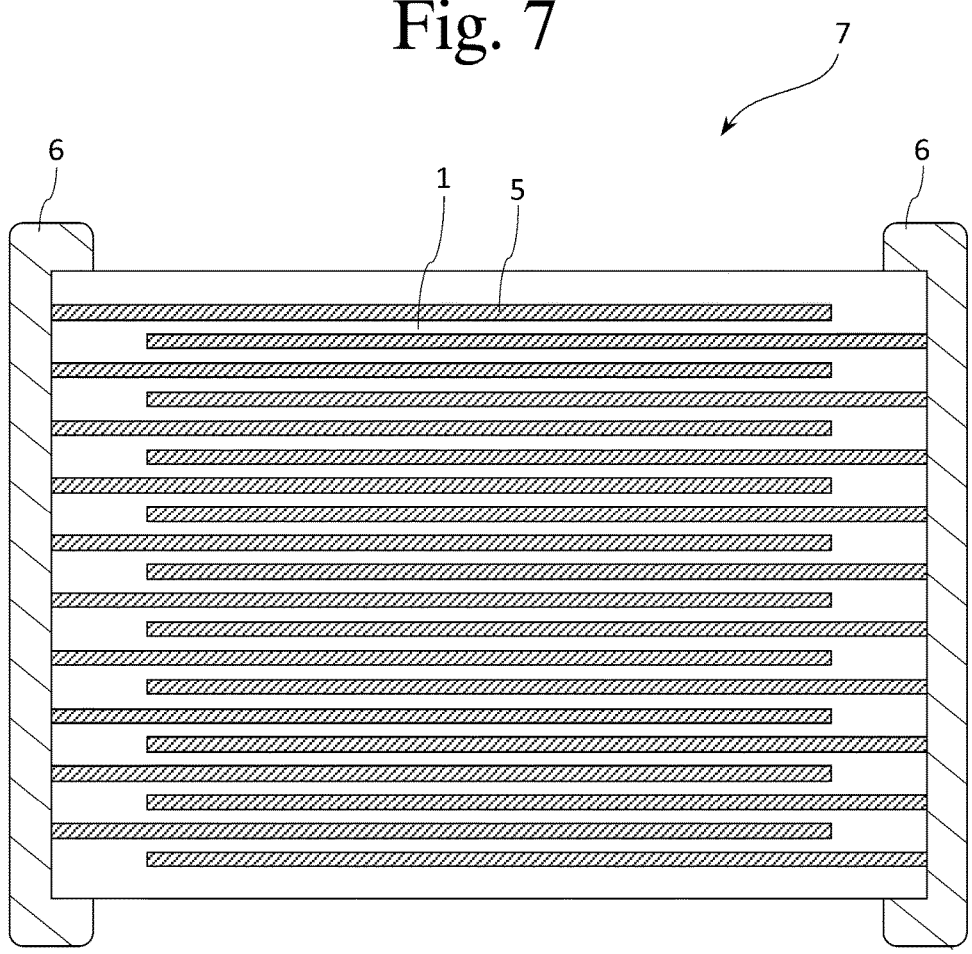

COMPOSITE PIEZOELECTRIC CERAMIC AND PIEZOELECTRIC DEVICE

BACKGROUND OF THE INVENTION

1. Field of the Invention

The present invention relates to composite piezoelectric ceramics and piezoelectric devices.

2. Description of the Related Art

Piezoelectric ceramics produce a mechanical strain and a stress in response to the application of an electric field. Piezoelectric ceramics showing such a piezoelectric phenomenon are used in various piezoelectric devices such as actuators, piezoelectric oscillations, speakers and sensors. Further, the materials have recently found use in vibration power generation.

Piezoelectric ceramic actuators have characteristics such as the ability to produce slight displacements with high precision and the ability to generate a high stress. For example, the piezoelectric ceramic actuators are used for positioning in precision machine tools and optical apparatuses. The most frequent piezoelectric ceramic used in such actuators is lead zirconate titanate (PZT) having excellent piezoelectricity. However, the fact that PZT contains a large amount of lead (Pb) has recently given rise to a concern about its adverse effects on global environment such as the elution of Pb by acid rain. Thus, there has been a demand that PZT be replaced by a piezoelectric ceramic material having a sufficiently decreased amount of Pb. In response to such needs, various Pb-free piezoelectric ceramic materials have been proposed.

Barium titanate ($BaTiO_3$) and potassium niobate ($KNbO_3$) are known Pb-free piezoelectric ceramic materials. To obtain improved piezoelectric characteristics, piezoelectric ceramic materials that are solid solutions including $BaTiO_3$ and $KNbO_3$ have been proposed.

For example, a piezoelectric ceramic composition represented by the chemical formula $x(Ba_{1-a}Ca_a)TiO_3$-$yKNbO_3$-$zNaNbO_3$ has been proposed (see Japanese Unexamined Patent Application Publication No. 2003-252681).

A piezoelectric ceramic that is a solid solution of plural components is generally known to exhibit high piezoelectric characteristics due to the presence of a morphotropic phase boundary (MPB), for example, a tetragonal/orthorhombic phase boundary. Thus, crystal phase boundaries in binary or ternary solid solutions have been actively studied.

Japanese Unexamined Patent Application Publication No. 2009-227482 discloses a piezoelectric ceramic that is based on a binary solid solution containing $KNbO_3$ and $BaTiO_3$, the molar ratio of $KNbO_3$ relative to the total of the two components being 0.5 to 0.9.

In a binary system such as that in Japanese Unexamined Patent Application Publication No. 2009-227482, it has been recognized that a crystal phase boundary exists in a composition containing the two components in extremely different proportions. Thus, it has been considered that piezoelectricity is exhibited only when the material has an unbalanced composition containing the components in extremely different proportions.

Further, the $KNbO_3$/$BaTiO_3$ binary system has a very narrow range of temperatures at which it can be sintered. Consequently, the material cannot be sintered at an excessively low sintering temperature to fail to achieve sufficient piezoelectric characteristics, whereas excessively high sintering temperatures cause problems such as variations in the composition due to the evaporation of elements such as potassium (K).

Japanese Unexamined Patent Application Publication No. 2012-254913 discloses a composite piezoelectric ceramic which has a layer including at least one of $KNbO_3$ and $NaNbO_3$ on the surface of a compact of $BaTiO_3$ crystal particles.

Because the structure described in Japanese Unexamined Patent Application Publication No. 2012-254913 is based on a compact of $BaTiO_3$ crystal particles, a tetragonal to cubic structural change occurs at near the Curie temperature (Tc) of $BaTiO_3$, resulting in significant changes in dielectric constant and piezoelectric characteristics. Once a cubic structure has been formed at or above the Tc, it is impossible to obtain sufficient piezoelectric characteristics even after the temperature is decreased.

The Tc of $BaTiO_3$ is as low as about 120° C. This fact disadvantageously limits the service temperature of piezoelectric ceramics composed solely of or based on $BaTiO_3$ to 100° C. or below.

Solid solutions of $BaTiO_3$ and other components proposed in the art compare unfavorably to Pb-containing materials in terms of piezoelectric characteristics and are incapable of producing a sufficiently large displacement. Thus, there have been demands for piezoelectric ceramics that are composed of Pb-free materials, are free from the limitation of use temperatures (in contrast to the use temperatures being limited to 100° C. or below as described above) and exhibit sufficient and excellent piezoelectric characteristics, as well as demands for processes for the production of such piezoelectric ceramics.

SUMMARY OF THE INVENTION

The present invention has been made in light of the circumstances discussed above. It is therefore an object of the invention to provide composite piezoelectric ceramics and piezoelectric devices which are configured such that the displacement of actuators may be increased without the use of Pb, that the ceramics contain a reduced amount of $BaTiO_3$ and consequently the Tc of the composite piezoelectric ceramics may be increased as compared to $BaTiO_3$ alone or as the base and the dependency of the displacement on temperatures may be enhanced, and further that the materials may be easily produced into compacts at a low temperature of 300° C. or below.

To achieve the above object, the present inventors have invented a composite piezoelectric ceramic including a solid solution and a compound layer disposed on the surface of the solid solution while forming a heterojunction at the interface therebetween, the solid solution including at least one of $KNbO_3$ and $NaNbO_3$, the compound layer including $BaTiO_3$.

An increase in Tc may be obtained by disposing a thin layer including $BaTiO_3$ so as to form a heterojunction with the surface of a compact of a solid solution which includes high-Tc components such as $KNbO_3$. The thickness of the $BaTiO_3$ layer is preferably 10 nm to 500 nm. This thickness ensures that the influence of the Tc of $BaTiO_3$ is limited and the composite piezoelectric ceramic may exhibit piezoelectric characteristics (produce a displacement) even at temperatures exceeding 100° C.

With the above configuration, a composite piezoelectric ceramic may be obtained which exhibits piezoelectric characteristics (produces a displacement) even at temperatures exceeding 100° C. Further, the above configuration makes it possible to decrease the sintering temperature to low temperatures of 300° C. or below.

In the composite piezoelectric ceramic provided according to the invention, the solid solution may further include LiNbO$_3$.

The addition of LiNbO$_3$ to the crystal particle compact further enhances the piezoelectric characteristics (the displacement).

In the composite piezoelectric ceramic provided according to the invention, the BaTiO$_3$ constituting the layer having a heterojunction with the solid solution may have a molar ratio of 0.05 to 1.0 relative to the total of KNbO$_3$, NaNbO$_3$ and LiNbO$_3$.

If the molar ratio of BaTiO$_3$ relative to the total of KNbO$_3$, NaNbO$_3$ and LiNbO$_3$ is less than 0.05, the BaTiO$_3$ phase is not grown sufficiently and high piezoelectric characteristics (a large displacement) cannot be obtained.

If the molar ratio of BaTiO$_3$ exceeds 1.0, the high proportion of BaTiO$_3$ leads to a decrease in the influence of the core having a high Tc, namely, the solid solution including at least one of KNbO$_3$ and NaNbO$_3$. Consequently, a phase change is caused at high temperatures exceeding 100° C., resulting in a marked decrease in piezoelectric characteristics (displacement).

Another aspect of the invention resides in a piezoelectric device including a pair of electrodes and the composite piezoelectric ceramic disposed between the pair of electrodes.

Another aspect of the invention resides in a piezoelectric device including an element and a pair of terminal electrodes disposed on both end faces of the element so as to sandwich the element, the element including an alternate stack of the composite piezoelectric ceramics and internal electrodes, the terminal electrodes being electrically connected to the internal electrodes.

In the invention, a compact includes a solid solution containing at least one oxide having a chemical composition different from BaTiO$_3$, namely, at least one of KNbO$_3$ and NaNbO$_3$, and a layer including BaTiO$_3$ is formed on the surface of the compact while forming a heterojunction. With this configuration, it becomes possible to provide piezoelectric devices having a piezoelectric ceramic that exhibits excellent piezoelectric characteristics and temperature characteristics without the use of Pb.

An increase in Tc may be obtained by disposing a BaTiO$_3$-containing layer in a small thickness on the surface of a compact of a solid solution which includes high-Tc components such as KNbO$_3$ while forming a heterojunction. Such composite piezoelectric ceramics exhibit piezoelectric characteristics (produce a displacement) even at temperatures exceeding 100° C. Further, the materials may be produced at a low sintering temperature of 300° C. or below.

BRIEF DESCRIPTION OF THE DRAWINGS

FIGS. 6A to 6E are STEM-EDS images illustrating a composite ceramic having a heterojunction in the invention, specifically, the evaluation result ⊙ in Table 1 (Example 3).

FIG. 7 is a schematic cross section showing a piezoelectric device according to another embodiment of the present invention.

DESCRIPTION OF THE PREFERRED EMBODIMENTS

Some aspects and embodiments of the present invention will be described in detail with reference to the drawings. The embodiments described below are only illustrative and do not limit the scope of the invention. The constituent elements described below comprehend other elements easily anticipated by the skilled person or substantially identical elements. The constituent elements described below may be combined appropriately. The same reference signs will be used for similar or equivalent features throughout the description with reference to the drawings, and any overlaps will not be explained at each occurrence.

Figure 1:
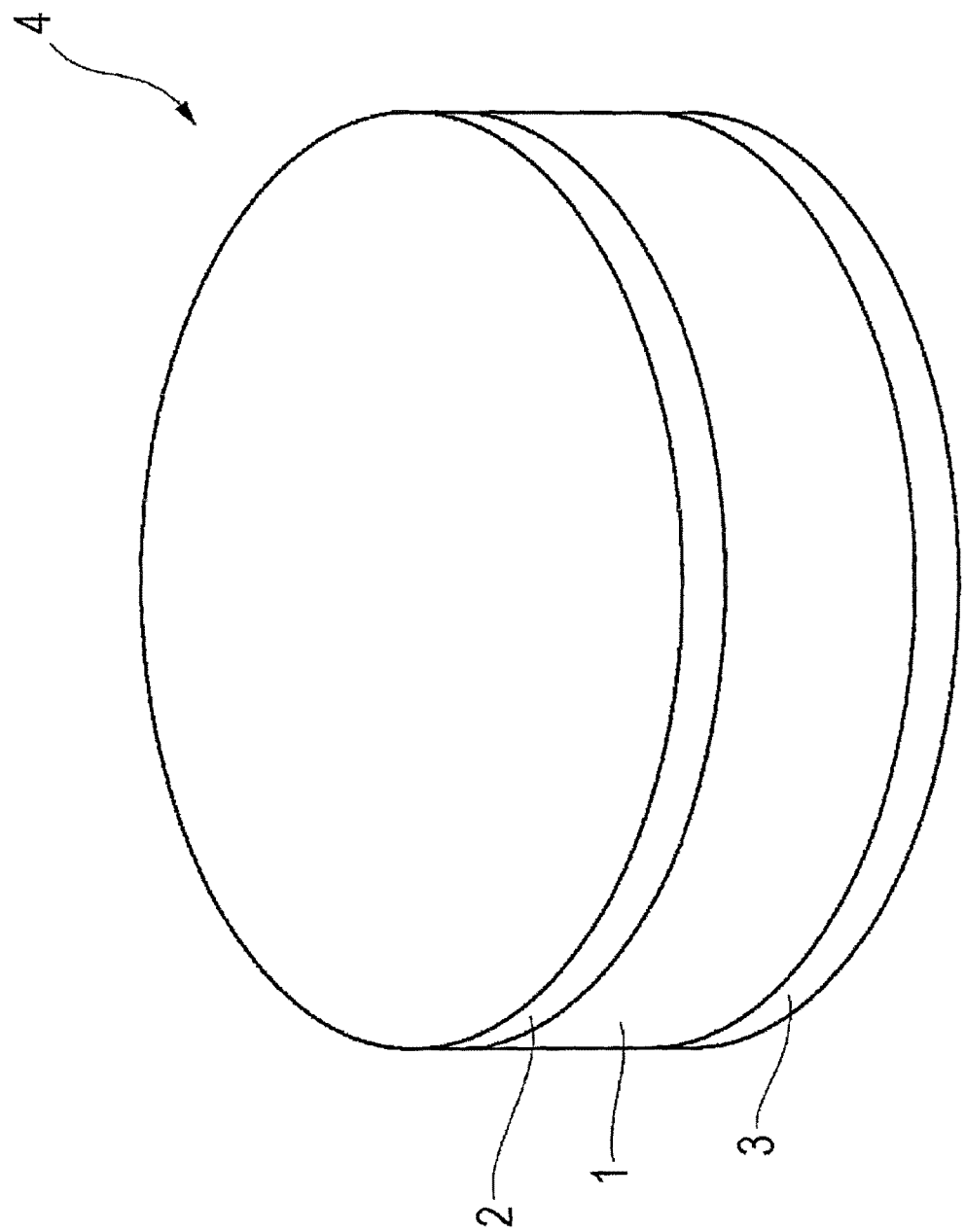
FIG. 1 is a perspective view illustrating an embodiment of piezoelectric devices of the invention.

FIG. 1 is a perspective view illustrating an embodiment of piezoelectric devices of the invention. A piezoelectric device 4 includes a composite piezoelectric ceramic 1 and a pair of electrodes 2 and 3 disposed on a pair of opposite faces of the composite piezoelectric ceramic 1.

For example, the composite piezoelectric ceramic 1 is polarized in the thickness direction, namely, in the direction in which the pair of electrodes 2 and 3 are opposed to each other. The application of a voltage through the electrodes 2 and 3 causes the composite piezoelectric ceramic to be oscillated vertically in the thickness direction and planarly in the radius direction. For example, the electrodes 2 and 3 are made of a metal such as Au. The electrodes 2 and 3 may be electrically connected to an external power supply via wires or the like (not shown).

The composite piezoelectric ceramic 1 includes a compact of composite oxide crystal particles including at least one of KNbO$_3$ and NaNbO$_3$ and optionally further including LiNbO$_3$, and the surface of the compact is coated with a layer which contains BaTiO$_3$ in a molar ratio (z) of 0.05 to 1.0 relative to the total of KNbO$_3$, NaNbO$_3$ and LiNbO$_3$.

The molar ratio is preferably 0.2 to 1.0, and particularly preferably 0.2 to 0.8.

The compositional formula of the composite piezoelectric ceramic may be represented by General Formula (1):

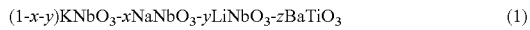

$$(1-x-y)\text{KNbO}_3\text{-}x\text{NaNbO}_3\text{-}y\text{LiNbO}_3\text{-}z\text{BaTiO}_3 \quad (1)$$

Effects may be obtained when the NaNbO$_3$ molar ratio (x) is in the range of 0 to 1.0. On the other hand, the LiNbO$_3$ molar ratio (y) is preferably 0 to 0.1, and particularly preferably 0 to 0.05.

In General Formula (1), niobium (Nb) may be partially replaced by tantalum (Ta); titanium (Ti) may be partially replaced by zirconium (Zr) and/or hafnium (Hf); and barium (Ba) may be partially replaced by magnesium (Mg), calcium (Ca) or strontium (Sr).

For example, the composite piezoelectric ceramic 1 may be produced by solvothermal synthesis. Solvothermal synthesis is a method that produces compounds by reaction at high pressure using an organic solvent. With this technique, the synthesis is possible at low temperatures of 300° C. or below. In the process of growing a compound layer on the surface of cores such as ceramic particles, calcined products or compacts, the ability to allow the layer to grow (react) at low temperatures suppresses the reaction (dissolution)

between the ceramics. The synthesis method is not limited to solvothermal synthesis and may be a general hydrothermal synthesis method.

Figure 2:
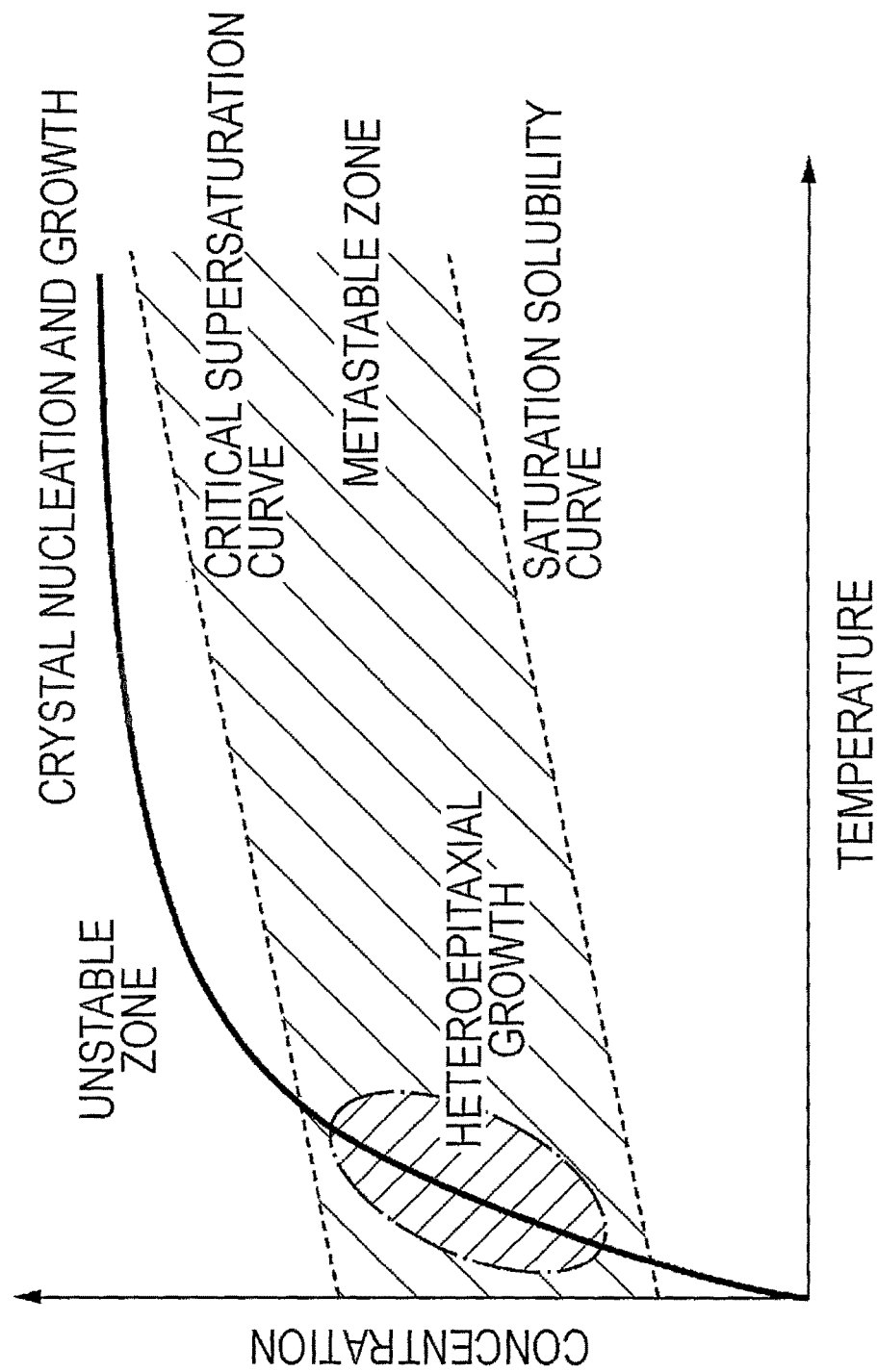
FIG. 2 is a LaMer diagram illustrating the progress of a reaction in the invention.

FIG. 2 is a LaMer diagram illustrating the progress of a solvothermal reaction, the horizontal axis representing the temperature and the vertical axis the concentration of an element participating in the reaction (in the invention, $Ba(OH)_2$).

Crystal nucleation occurs above the critical supersaturation curve. In the metastable zone, the crystal nucleus grows but no crystal nucleation occurs. First, the conditions that cause the generation of $BaTiO_3$ crystal nucleus (nucleation) to occur, and the metastable zone conditions are examined. By allowing the reaction to take place in the metastable zone (temperatures and concentrations), a $BaTiO_3$ layer may be grown on the surface of $KNbO_3$ particles as the core while forming a heterojunction. In this manner, a composite piezoelectric ceramic 1 having an artificial heterojunction (an MPB structure) may be prepared.

The relative density of the composite piezoelectric ceramic 1 is preferably not less than 30%. When the composite piezoelectric ceramic 1 is used in a piezoelectric power generation device, a large amount of power generation may be obtained by reducing the relative density to below the level used in usual piezoelectric ceramics.

For use in other devices such as actuators, the relative density of the composite piezoelectric ceramic 1 is preferably not less than 90%. The relative density of the composite piezoelectric ceramic 1 may be determined by an Archimedes method. The relative density of the composite piezoelectric ceramic 1 may be controlled by adjusting the density of the crystal particle compact (by adjusting conditions such as the type and the amount of a binder, and the compacting pressure), and the conditions of the solvothermal reaction (such as the concentration, the reaction temperature and the reaction time).

As auxiliary components, the composite piezoelectric ceramic 1 may contain manganese (Mn) compounds such as Mn oxide and copper (Cu) compounds such as Cu oxide.

The addition of Mn compounds and Cu compounds may enhance the mechanical quality factor (Qm) of the composite piezoelectric ceramic 1.

The composite piezoelectric ceramic 1 has a stoichiometric composition including $KNbO_3$ and $BaTiO_3$. The composition is not necessarily exactly stoichiometric because the production with the exact stoichiometric composition is difficult and also because higher reliability may be obtained by intentional manipulation of the composition such as by reducing the amount of potassium (K).

The composite piezoelectric ceramic 1 may contain Pb, but the Pb content is preferably not more than 1 mass %. It is more preferable that Pb be completely absent.

The reduction of Pb content to a sufficiently low level makes it possible to decrease to the minimum the volatilization of Pb during calcination and also to minimize the discharge of Pb to the environment when the piezoelectric ceramics marketed as piezoelectric components such as piezoelectric devices are disposed of.

For example, the composite piezoelectric ceramics 1 may be suitably used as materials in various piezoelectric devices, for example, piezoelectric power generation devices, oscillation devices such as actuators, and buzzers, speakers and sensors.

FIG. 7 is a schematic cross section showing another embodiment of a piezoelectric device of the invention. A piezoelectric device 7 includes a plurality of composite piezoelectric ceramic layers 1 and a plurality of internal electrodes 5 stacked alternately. The internal electrodes 5 are extended alternately in the opposite directions and electrically connected at the extended opposite ends thereof to a pair of terminal electrodes (external electrodes) 6.

Next, there will be described a process for producing the piezoelectric device 4 illustrated in FIG. 1.

First, a raw material of a main component of the composite piezoelectric ceramic 1, for example, a $KNbO_3$ powder, is provided and is sufficiently dried. Separately, a titanium oxide ($TiO_2$) powder as a raw material for forming $BaTiO_3$ on the surface of $KNbO_3$ is dried similarly. The $KNbO_3$ powder and the $TiO_2$ powder are weighed and are mixed with each other in a ball mill. The mixture is dried and is admixed with an organic solvent containing a binder. The resultant mixture is dried and is compacted into a disc. The disc of the mixture of $KNbO_3$ and $TiO_2$ is heated at 500° C. to 800° C. for 2 to 12 hours to remove the binder, thus affording a mixture powder compact.

Components such as a solvent and a prescribed amount of $Ba(OH)_2$ are added to a container and are sufficiently mixed together by stirring. The mixture powder compact is placed into the solvent, and a reaction is performed in an autoclave at 170° C. to 250° C. for 2 to 24 hours (solvothermal synthesis). After the reaction, the mixture powder compact is washed with ethanol and pure water and is dried at 150° C. to 300° C. A $KNbO_3$—$BaTiO_3$ composite piezoelectric ceramic 1 is thus obtained.

Next, the composite piezoelectric ceramic 1 obtained is processed as required, and electrodes 2 and 3 are formed on a pair of surfaces of the composite piezoelectric ceramic 1. In a hot silicone oil, an electric field is applied to perform a polarization treatment. In this manner, there may be obtained the composite piezoelectric ceramic 1 illustrated in FIG. 1, and the piezoelectric device 4 which includes the composite piezoelectric ceramic 1 and the electrodes 2 and 3 disposed to interpose the composite piezoelectric ceramic 1 therebetween. The electrodes 2 and 3 may be formed by sputtering a metal such as Au.

EXAMPLES

Examples 1 to 6

<Preparation of $KnbO_2$—$Batio_2$ Composite Piezoelectric Ceramic>

A $KNbO_3$ powder and a $TiO_2$ powder were provided and were dried sufficiently. The powders were weighed so as to obtain a $BaTiO_3/MbO_3$ ratio (after the reaction) described in Table 1, and were added to a fluorine-coated resin container together with zirconia balls (3 mm in diameter). Ethyl alcohol was added, and mixing was performed for 16 hours.

The slurry of the mixture was separated from the zirconia balls, dried at 80° C., and crushed with a mortar and a pestle. As a binder, polyvinyl butyral (PVB) was added in an amount of 2 wt % relative to the dry powder and was mixed therewith sufficiently. The mixture was classified with a sieve having an opening of 250 μm.

After the classification, approximately 0.5 g of the powder was weighed and was placed into a mold 10 mm in diameter. With an oil hydraulic press machine, the powder was compacted into a disc under a pressure of 2 ton. The $KNbO_3$—$TiO_2$ disc obtained by the compaction was heated at 600° C. for 10 hours to remove the binder, thus affording a mixture powder compact.

Into a 25 ml volume container, 10 ml of water as the solvent and an amount of $Ba(OH)_2$ prescribed to obtain the molar ratio described in Table 1 were added and were sufficiently mixed together by stirring. The $KNbO_5$—$TiO_2$ mixture powder compact that had been cleaned of the binder was placed into the liquid, and a reaction was performed in an autoclave at 180° C. for 20 hours. After the reaction, the mixture powder compact was washed with ethanol and pure water and was dried at 200° C. A $KNbO_3$—$BaTiO_3$ composite piezoelectric ceramic 1 was thus obtained.

<Electrical Evaluation of $KNbO_3$—$BaTiO_3$ Composite Piezoelectric Ceramic>

Au electrodes 2 and 3 illustrated in FIG. 1 were formed by a sputtering method on the samples prepared in Examples 1 to 6, thereby producing piezoelectric devices 4 illustrated in FIG. 1. The piezoelectric devices 4 were subjected to an electric field at 0.1 Hz frequency and 1 to 30 kV/cm, and the piezoelectric strain (the displacement) was measured with use of an electric field induced strain meter (JP005-SE manufactured by Kitamoto Denshi Kabushiki Kaisha). The piezoelectric constant $d_{33}$ was calculated from the strain, the results being shown in Table 1. As a result, it was confirmed that high piezoelectric characteristics were obtained when the $BaTiO_3$ ratio was in the range of 0.05 to 1.5.

and after the reaction. Because $KNbO_3$ and $BaTiO_3$ are both perovskite structures having similar lattice constants, the growth of $BaTiO_3$ may be confirmed based on changes in the shapes of the peaks assigned to the above planes of the $KNbO_3$ crystal particles.

Figure 3:
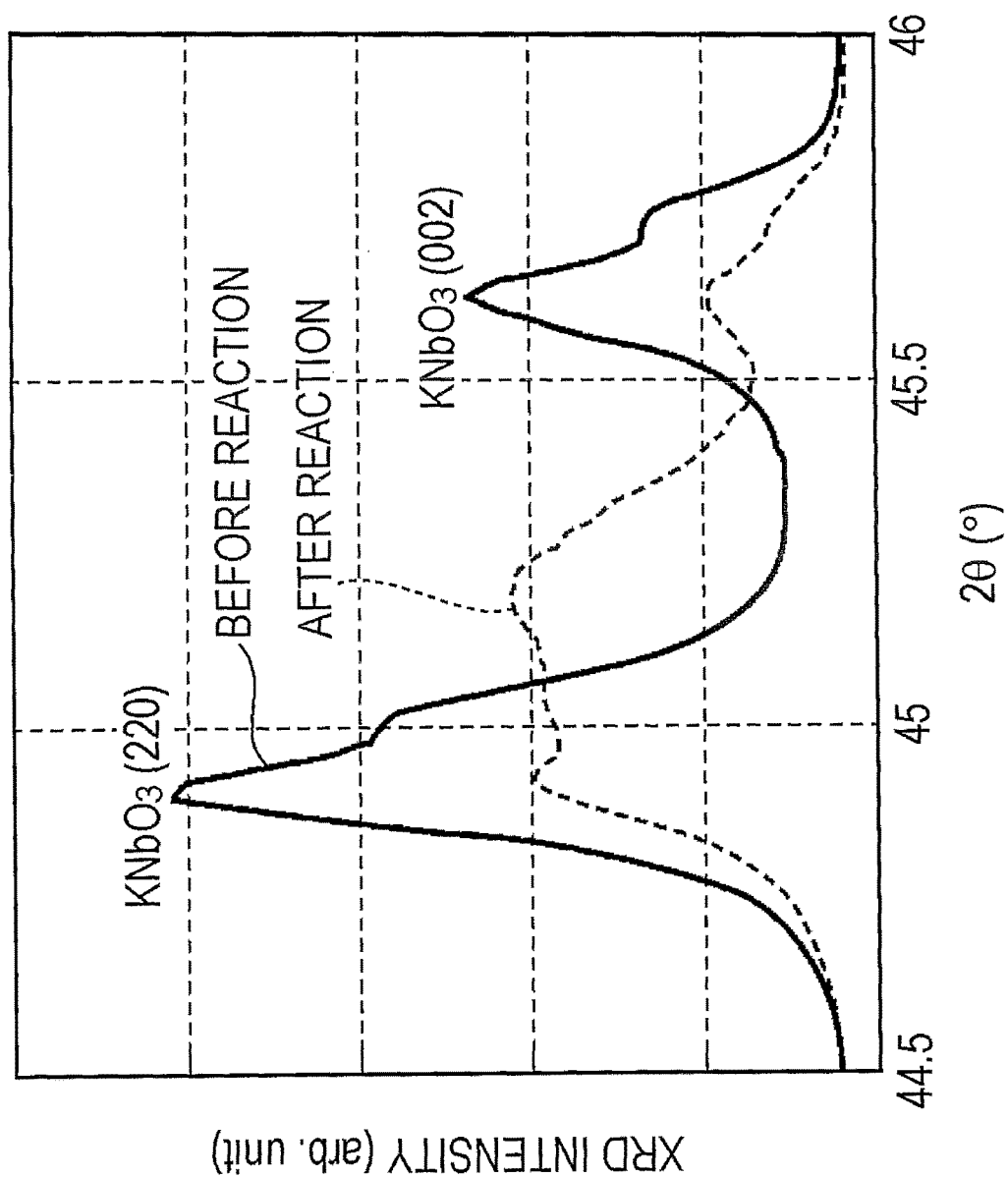
FIG. 3 is an X-ray diffraction pattern showing the presence of a heterojunction in the invention, specifically, the evaluation result ⊙ in Table 1 (Example 3)

As an example, XRD peaks in Example 3 illustrated in FIG. 3 will be discussed. The peaks are assigned to a (220) plane and a (002) plane of orthorhombic $KNbO_3$. In the XRD pattern after the solvothermal reaction, the (220) and (002) peaks of $KNbO_3$ are smaller than the $KNbO_3$ peaks before the reaction, and a peak assigned to (200) of tetragonal $BaTiO_3$ appears near 45.2° to cause the profile of the peaks to be distorted. This change indicates the formation of $BaTiO_3$. The results of the identification of $BaTiO_3$ are described in Table 1. In Table 1, ☉ shows that the intensity of the $BaTiO_3$ (200) peak was approximately 0.7 to 2 times greater than the intensity of the $KNbO_3$ (220) peak as was the case in FIG. 3.

Figure 4:
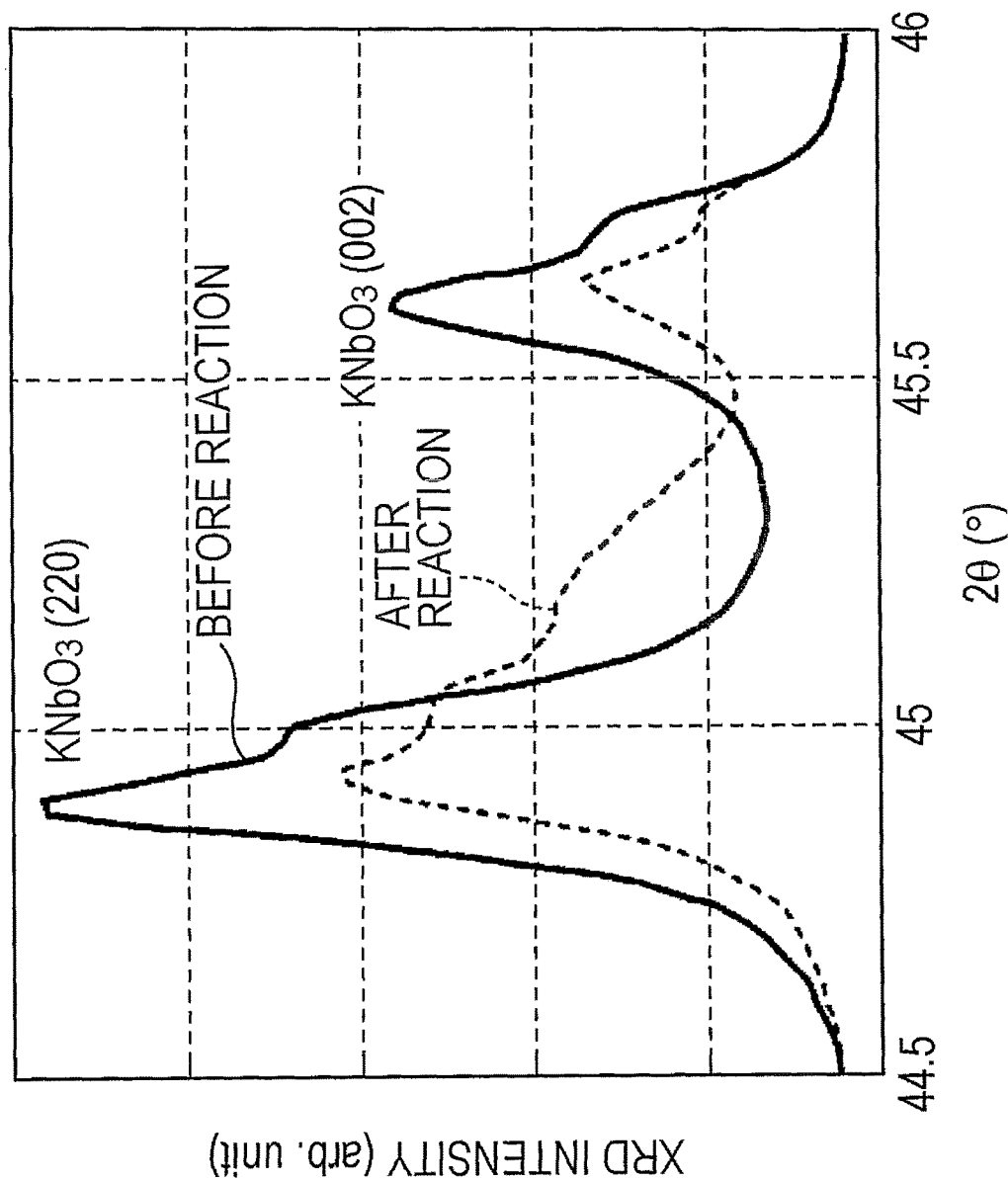
FIG. 4 is an X-ray diffraction pattern showing the presence of a heterojunction in the invention, specifically, the evaluation result ○ in Table 1 (Example 1)

FIG. 4 shows peaks assigned to a (220) plane and a (002) plane of orthorhombic $KNbO_3$ in Example 1. As compared to FIG. 3, the decrease in the intensity of the (220) plane

TABLE 1

| | Solid solution composition | | | Molar ratio of | Reaction | $BaTiO_3$ | | Change in specific dielectric constant |
|---|---|---|---|---|---|---|---|---|
| | $KNbO_3$ molar ratio | $NaNbO_3$ molar ratio | $LiNbO_3$ molar ratio | $BaTiO_3$ to solid solution | temperature (° C.) | phase (by XRD) | $d_{33}$ (pm/V) | by temperature (−40 to 150° C.) (%) |
| Ex. 1 | 1.00 | 0.00 | 0.00 | 0.05 | 180 | ○ | 152 | 2.5 |
| Ex. 2 | 1.00 | 0.00 | 0.00 | 0.20 | 180 | ☉ | 268 | 6.7 |
| Ex. 3 | 1.00 | 0.00 | 0.00 | 0.50 | 180 | ☉ | 283 | −2.4 |
| Ex. 4 | 1.00 | 0.00 | 0.00 | 0.80 | 180 | ☉ | 311 | −7.0 |
| Ex. 5 | 1.00 | 0.00 | 0.00 | 1.00 | 180 | ☉ | 294 | −9.2 |
| Ex. 6 | 1.00 | 0.00 | 0.00 | 1.50 | 180 | ☉ | 296 | −24.6 |
| Ex. 7 | 0.00 | 1.00 | 0.00 | 0.50 | 180 | ☉ | 277 | −7.9 |
| Ex. 8 | 0.50 | 0.50 | 0.00 | 0.50 | 180 | ☉ | 283 | −7.3 |
| Ex. 9 | 0.495 | 0.495 | 0.01 | 0.50 | 180 | ☉ | 298 | −7.0 |
| Ex. 10 | 0.49 | 0.49 | 0.02 | 0.50 | 180 | ☉ | 291 | −8.1 |
| Ex. 11 | 0.45 | 0.45 | 0.10 | 0.50 | 180 | ☉ | 288 | −8.3 |
| Comp. Ex. 1 | 1.00 | 0.00 | 0.00 | 0.00 | — | X | — | 1.4 |
| Comp. Ex. 2 | 1.00 | 0.00 | 0.00 | 0.02 | 180 | X | 82 | 1.9 |
| Comp. Ex. 3 | 0.44 | 0.44 | 0.12 | 0.50 | 180 | ☉ | 236 | −8.9 |
| Comp. Ex. 4 | 1.00 | 0.00 | 0.00 | 0.20 | 1150 | — | 128 | 6.5 |
| Comp. Ex. 5 | 1.00 | 0.00 | 0.00 | 0.50 | 1150 | — | 260 | −9.3 |

Further, the samples were tested in a thermostatic chamber with an impedance analyzer (4294A manufactured by Agilent Technologies, Inc.) to determine the temperature dependency of specific dielectric constant at −40° C. to 150° C. With the specific dielectric constant at 25° C. as the reference, the greatest change in specific dielectric constant caused in the above temperature range was measured, the results being shown in Table 1. As a result, the samples having a $BaTiO_3$ ratio of 0.05 to 1.0 exhibited a good temperature dependency with the greatest change in specific dielectric constant being within 100, whereas a $BaTiO_3$ ratio of 1.5 resulted in equal to or more than 20% change in specific dielectric constant.

<Identification of $BaTiO_3$ Phase>

The $KNbO_3$—$BaTiO_3$ composite piezoelectric ceramics 1 were analyzed on an X-ray diffractometer manufactured by Rigaku Corporation using a CuKα ray at a tube voltage of 50 kV, a tube current of 40 mA and a scanning rate of 20°/min.

Regarding the crystal structure of the composite piezoelectric ceramic 1, in particular, the peaks assigned to a (220) plane and a (002) plane of the solid solution including orthorhombic $KNbO_3$ change their shapes between before peak and the (002) plane peak of orthorhombic $KNbO_3$ is small and the peak assigned to (200) of $BaTiO_3$ is also small. This indicates that the amount of $BaTiO_3$ formed is small. In Table 1, ○ shows that the intensity of the $BaTiO_3$ (200) peak was less than 0.7 times the intensity of the $KNbO_3$ (220) peak as was the case in Example 1.

The formation of tetragonal $BaTiO_3$ on the surface of orthorhombic $KNbO_3$ results in a strain at the interface due to a slight lattice constant mismatch. This is probably the reason why dielectric characteristics and piezoelectric characteristics are enhanced.

The $KNbO_3$—$BaTiO_3$ composite piezoelectric ceramic 1 of Example 3 was processed into thin films with use of focused ion beam (FIB), thereby preparing samples for microstructure analysis and composition analysis. With a STEM manufactured by Hitachi High-Technologies Corporation, scanning transmission images of the samples were taken at an accelerating voltage of 200 kV and a field-of-view size of about 1×1 μm. With the attached energy-dispersive spectrometer (EDS), elements were mapped using characteristic X-rays, specifically, an Lβ2 X-ray for Ba, a Kα X-ray for Ti, a Kα X-ray for K, and an Lα X-ray for Nb. The results are illustrated in FIGS. 6A to 6E. FIG.

6A is a STEM image, FIG. 6B Ba distribution, FIG. 6C Ti distribution, FIG. 6D K distribution, and FIG. 6E Nb distribution. In the images, the elements are distributed in higher concentrations in whiter regions. FIGS. 6B to 6E show that $BaTiO_3$ covers the $KNbO_3$ core.

Further, the lattices were observed using the STEM and a heterojunction between $KNbO_3$ and $BaTiO_3$ was confirmed.

Examples 7 to 11

Samples were prepared and evaluated in the same manner as in Examples 1 to 6, except that the $KNbO_3$ powder was replaced by a $NaNbO_3$ powder, that the $KNbO_3$ powder was combined with a $NaNbO_3$ powder, or that the $KNbO_3$ powder was combined with a $NaNbO_3$ powder and a $LiNbO_3$ powder. The results are described in Table 1. All the samples exhibited high piezoelectric characteristics, and the temperature dependency of specific dielectric constant was within 10% in all cases. The presence of $BaTiO_3$ was confirmed by XRD.

Comparative Examples 1 to 3

$KNbO_3$, $NaNbO_3$, $LiNbO_3$—$BaTiO_3$ composite piezoelectric ceramics 1 were produced in the same manner as in Examples 1 to 11, except that the molar ratio of $BaTiO_3$ to $KNbO_3$, $NaNbO_3$ and $LiNbO_3$ was changed as described in Table 1. Electrodes were formed in the similar manner, and the piezoelectric strain (the displacement) and the piezoelectric constant $d_{33}$ were measured, the results being described in Table 1. The measurement of $d_{33}$ was infeasible when $BaTiO_3$ had failed to form a layer with a heterojunction with the core. When the $BaTiO_3$ ratio was 0.02, a low piezoelectric constant $d_{33}$ was observed. The addition of $LiNbO_3$ in a molar ratio of 0.12 resulted in a marked decrease in $d_{33}$.

Figure 5:
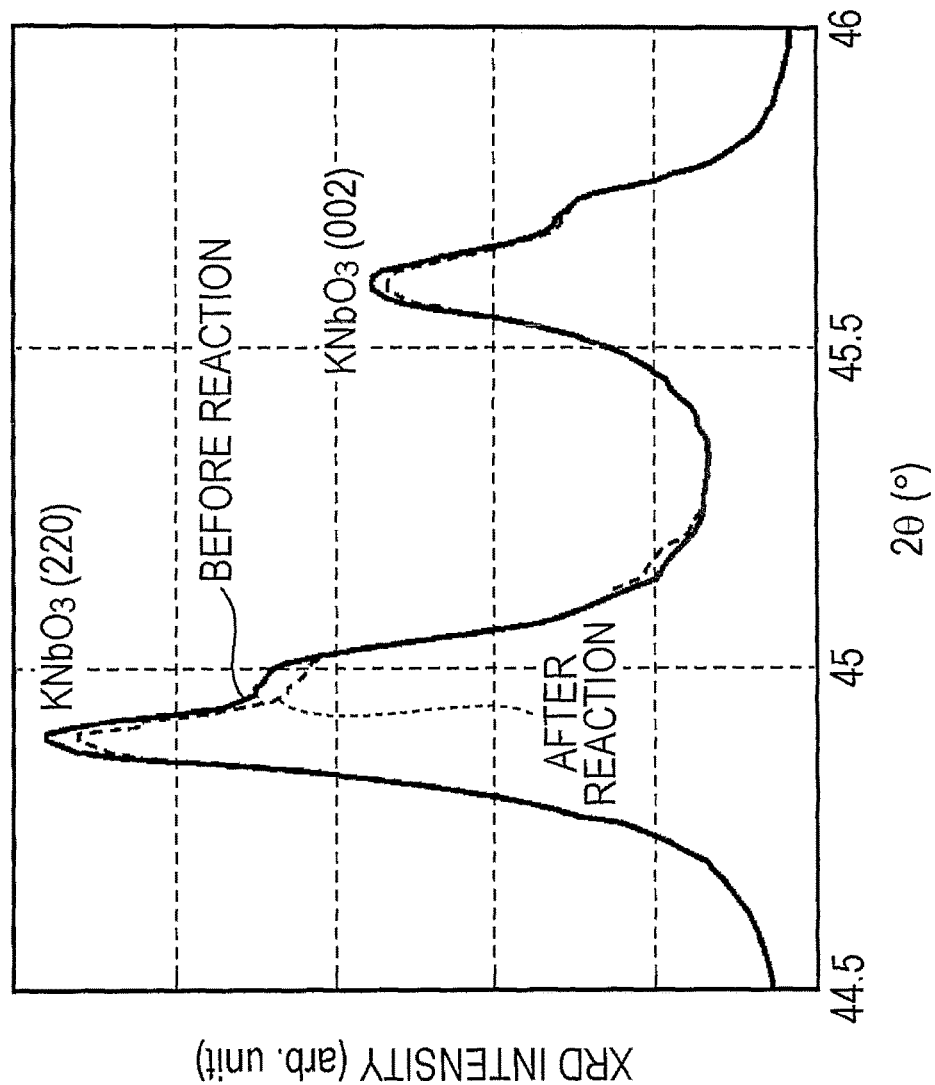
FIG. 5 is an X-ray diffraction pattern showing a failure of appropriate formation of a heterojunction in the invention, specifically, the evaluation result x in Table 1 (Comparative Example 2)

Further, the identification of a $BaTiO_3$ phase was performed in the same manner as in Examples 1 to 11, the results being described in Table 1. In Comparative Example 2, as illustrated in FIG. 5, the XRD pattern after the solvothermal reaction had only the peaks assigned to the (220) and (002) planes of orthorhombic $KNbO_3$, and no peak assigned to $BaTiO_3$ was observed (x in Table 1).

Comparative Examples 4 and 5

$KNbO_3$—$BaTiO_3$ piezoelectric ceramics were produced through conventional ceramic production steps (a solid phase process) at a sintering temperature of 1150° C. They were evaluated by the same methods as in Examples 1 to 11 to determine the piezoelectric constant $d_{33}$. The results are described in Table 1. The piezoelectric constant $d_{33}$ was as low as 128 pm/V when the $BaTiO_3$ ratio was 0.2, but was increased to 260 pm/v when the $BaTiO_3$ ratio was raised to 0.5. However, the high synthesis (sintering) temperature is a factor that increases the cost due to the large amount of energy consumed during the sintering.

Piezoelectric ceramics produce a mechanical strain and a stress in response to the application of an electric field. Piezoelectric ceramics showing such a piezoelectric phenomenon are used in various piezoelectric devices such as actuators, piezoelectric buzzers, speakers and sensors. Further, the materials have recently found use in vibration power generation. The composite piezoelectric ceramics of the invention are highly useful in such piezoelectric applications.

What is claimed is:

1. A composite piezoelectric ceramic comprising:
   a solid solution including at least one of potassium niobate ($KNbO_3$) and sodium niobate ($NaNbO_3$), and
   a compound layer disposed on the surface of the solid solution while forming a heterojunction at the interface therebetween, the compound layer including barium titanate ($BaTiO_3$),
   wherein the molar ratio of $BaTiO_3$ relative to the total of components forming the solid solution is 0.2 to 1.0.

2. The composite piezoelectric ceramic according to claim 1, wherein the solid solution further includes lithium niobate ($LiNbO_3$).

3. A piezoelectric device comprising:
   a pair of electrodes, and
   a piezoelectric material disposed between the pair of electrodes, the piezoelectric material including the composite piezoelectric ceramic described in claim 1.

4. A piezoelectric device comprising:
   an element including an alternate stack of the composite piezoelectric ceramics described in claim 1 and internal electrodes, and
   a pair of terminal electrodes electrically connected to the internal electrodes.

5. A piezoelectric device comprising:
   a pair of electrodes, and
   a piezoelectric material disposed between the pair of electrodes, the piezoelectric material including the composite piezoelectric ceramic described in claim 2.

6. A piezoelectric device comprising:
   an element including an alternate stack of the composite piezoelectric ceramics described in claim 2 and internal electrodes, and
   a pair of terminal electrodes electrically connected to the internal electrodes.

7. The composite piezoelectric ceramic according to claim 1, wherein the molar ratio of $BaTiO_3$ relative to the total of components forming the solid solution is 0.2 to 0.8.

8. The composite piezoelectric ceramic according to claim 1, wherein the molar ratio of $BaTiO_3$ relative to the total of components forming the solid solution is 0.2 to 0.5.

* * * * *